US012712385B2

(12) United States Patent
Liu et al.

(10) Patent No.: US 12,712,385 B2
(45) Date of Patent: Aug. 18, 2026

(54) SYSTEMS AND METHODS FOR A COMPACT RECEIVER ASSEMBLY TO WIRELESSLY CHARGE AN ELECTRICAL VEHICLE

(71) Applicant: Toyota Motor Engineering & Manufacturing North America, Inc., Plano, TX (US)

(72) Inventors: Yanghe Liu, Ann Arbor, MI (US); Feng Zhou, Ann Arbor, MI (US)

(73) Assignees: TOYOTA MOTOR ENGINEERING & MANUFACTURING NORTH AMERICA, INC., Plano, TX (US); TOYOTA JIDOSHA KABUSHIKI KAISHA, Toyota (JP)

( * ) Notice: Subject to any disclaimer, the term of this patent is extended or adjusted under 35 U.S.C. 154(b) by 647 days.

(21) Appl. No.: 18/346,547

(22) Filed: Jul. 3, 2023

(65) Prior Publication Data

US 2025/0015634 A1 Jan. 9, 2025

(51) Int. Cl.
*H02J 50/10* (2016.01)
*B60L 53/12* (2019.01)
(Continued)

(52) U.S. Cl.
CPC .............. *H02J 50/10* (2016.02); *B60L 53/12* (2019.02); *H02J 7/70* (2026.01); *H05K 1/165* (2013.01);
(Continued)

(58) Field of Classification Search
CPC ... H02J 50/10; H02J 7/70; B60L 53/12; B60L 2210/30; H05K 1/165; H05K 7/1427
See application file for complete search history.

(56) References Cited

U.S. PATENT DOCUMENTS

2017/0279291 A1* 9/2017 Miele ...................... H01F 38/14
2022/0255358 A1 8/2022 Mao et al.

OTHER PUBLICATIONS

C. Panchal, "Investigations of High Efficiency Wireless Power Transfer Systems (WPTS) for Electric Vehicles (EVs)," Doctoral Dissertation, Griffith University, Apr. 2018, 272 pages.

(Continued)

*Primary Examiner* — Laura A Gudorf
(74) *Attorney, Agent, or Firm* — Jordan IP Law, LLC

(57) ABSTRACT

A method, computer program product, and receiver assembly. The receiver assembly may be created, wherein creating the receiver assembly may include placing a printed circuit board (PCB) coil pad of a PCB inside a cavity of a non-metal enclosure. Creating the receiver assembly may include placing a mesh frame on top of the PCB coil pad. Creating the receiver assembly may include placing one or more ferrite plates on top of the PCB coil pad based upon, at least in part, a configuration of the mesh frame. Creating the receiver assembly may include placing an insert on top of the one or more ferrite plates. Creating the receiver assembly may include placing a rectifier on top of the insert, wherein the rectifier may be connected to the PCB coil pad inside the cavity of the non-metal enclosure. Creating the receiver assembly may include placing an assembly lid on top of the rectifier, wherein the assembly lid and the non-metal enclosure may be coupled together to encapsulate the PCB coil pad, the mesh frame, the one or more ferrite plates, the insert, and the rectifier.

20 Claims, 10 Drawing Sheets

(51) Int. Cl.
*H02J 7/70* (2026.01)
*H05K 1/16* (2006.01)
*H05K 7/14* (2006.01)

(52) U.S. Cl.
CPC ........ *H05K 7/1427* (2013.01); *B60L 2210/30* (2013.01)

(56) References Cited

OTHER PUBLICATIONS

Z. Yan et al., "An LCC-P Compensated Wireless Power Transfer System with a Constant Current Output and Reduced Receiver Size," Energies, MDPI, Jan. 2019, 14 pages.

* cited by examiner

SYSTEMS AND METHODS FOR A COMPACT RECEIVER ASSEMBLY TO WIRELESSLY CHARGE AN ELECTRICAL VEHICLE

BACKGROUND

Electrical vehicles (EV) are great for the environment, as they may reduce air pollution and greenhouse gas emissions. The batteries of EVs may be charged using specialized plugs or may be charged wirelessly. Some wireless charging systems, such as a conventional Litz wire receiver pad and a separate coil/rectifier system, operate by having an inductive receiver pad wirelessly receive AC power energy from a transmitter. A rectifier converts AC power into DC power to charge the vehicle's battery.

BRIEF SUMMARY OF DISCLOSURE

In one example implementation, a method, performed by one or more computing devices and/or one or more people, may include but is not limited to creating a receiver assembly. Creating the receiver assembly may include placing a printed circuit board (PCB) coil pad of a PCB inside a cavity of a non-metal enclosure. Creating the receiver assembly may include placing a mesh frame on top of the PCB coil pad. Creating the receiver assembly may include placing one or more ferrite plates on top of the PCB coil pad based upon, at least in part, a configuration of the mesh frame. Creating the receiver assembly may include placing an insert on top of the one or more ferrite plates. Creating the receiver assembly may include placing a rectifier on top of the insert, wherein the rectifier may be connected to the PCB coil pad inside the cavity of the non-metal enclosure. Creating the receiver assembly may include placing an assembly lid on top of the rectifier, wherein the assembly lid and the non-metal enclosure may be coupled together to encapsulate the PCB coil pad, the mesh frame, the one or more ferrite plates, the insert, and the rectifier.

One or more of the following example features may be included. The insert may include a slot for receiving a cold plate. The PCB coil pad may include copper traces embedded in the PCB. The one or more ferrite plates may be a single ferrite plate having a size of the PCB coil pad. The one or more ferrite plates may be an array of ferrite plates with a gap between each ferrite plate of the array of ferrite plates. The gap may be determined based upon, at least in part, the mesh frame. The assembly lid may be attached directly to a vehicle chassis.

In another example implementation, a receiver assembly may include but is not limited to a printed circuit board (PCB) coil pad of a PCB inside a cavity of a non-metal enclosure. The receiver assembly may include a mesh frame on top of the PCB coil pad. The receiver assembly may include one or more ferrite plates on top of the PCB coil pad based upon, at least in part, a configuration of the mesh frame. The receiver assembly may include an insert on top of the one or more ferrite plates. The receiver assembly may include a rectifier on top of the insert, wherein the rectifier is connected to the PCB coil pad inside the cavity of the non-metal enclosure. The receiver assembly may include an assembly lid on top of the rectifier, wherein the assembly lid and the non-metal enclosure are coupled together to encapsulate the PCB coil pad, the mesh frame, the one or more ferrite plates, the insert, and the rectifier.

One or more of the following example features may be included. The insert may include a slot for receiving a cold plate. The PCB coil pad may include copper traces embedded in the PCB. The one or more ferrite plates may be a single ferrite plate having a size of the PCB coil pad. The one or more ferrite plates may be an array of ferrite plates with a gap between each ferrite plate of the array of ferrite plates. The gap may be determined based upon, at least in part, the mesh frame. The assembly lid may be attached directly to a vehicle chassis.

In another example implementation, a computer program product may reside on a computer readable storage medium having a plurality of instructions stored thereon which, when executed across one or more processors, may cause at least a portion of the one or more processors to perform operations that may include but are not limited to creating a receiver assembly. Creating the receiver assembly may include placing a printed circuit board (PCB) coil pad of a PCB inside a cavity of a non-metal enclosure. Creating the receiver assembly may include placing a mesh frame on top of the PCB coil pad. Creating the receiver assembly may include placing one or more ferrite plates on top of the PCB coil pad based upon, at least in part, a configuration of the mesh frame. Creating the receiver assembly may include placing an insert on top of the one or more ferrite plates. Creating the receiver assembly may include placing a rectifier on top of the insert, wherein the rectifier may be connected to the PCB coil pad inside the cavity of the non-metal enclosure. Creating the receiver assembly may include placing an assembly lid on top of the rectifier, wherein the assembly lid and the non-metal enclosure may be coupled together to encapsulate the PCB coil pad, the mesh frame, the one or more ferrite plates, the insert, and the rectifier.

One or more of the following example features may be included. The insert may include a slot for receiving a cold plate. The PCB coil pad may include copper traces embedded in the PCB. The one or more ferrite plates may be a single ferrite plate having a size of the PCB coil pad. The one or more ferrite plates may be an array of ferrite plates with a gap between each ferrite plate of the array of ferrite plates. The gap may be determined based upon, at least in part, the mesh frame. The assembly lid may be attached directly to a vehicle chassis.

The details of one or more example implementations are set forth in the accompanying drawings and the description below. Other possible example features and/or possible example advantages will become apparent from the description, the drawings, and the claims. Some implementations may not have those possible example features and/or possible example advantages, and such possible example features and/or possible example advantages may not necessarily be required of some implementations.

BRIEF DESCRIPTION OF THE DRAWINGS

Like reference symbols in the various drawings may indicate like elements.

DETAILED DESCRIPTION

Figure 1:
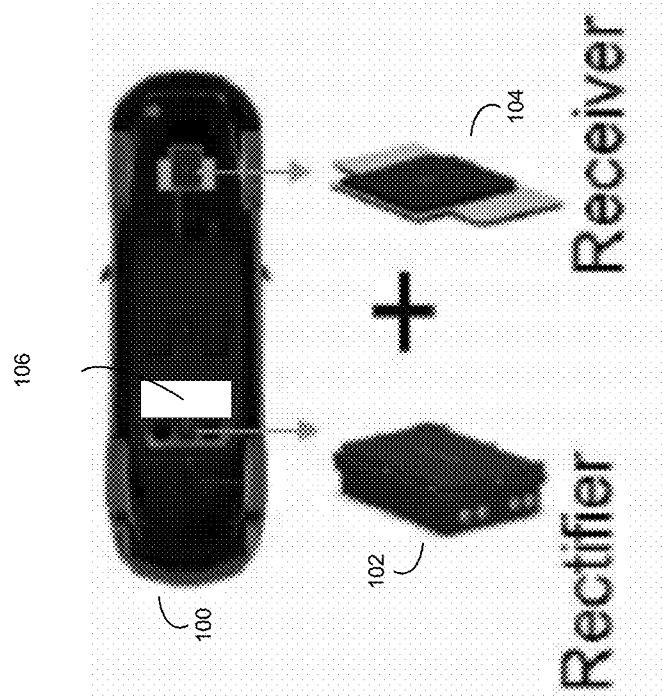
FIG. 1 is an example diagrammatic view of an electric vehicle according to one or more example implementations of the disclosure.
Figure 2:
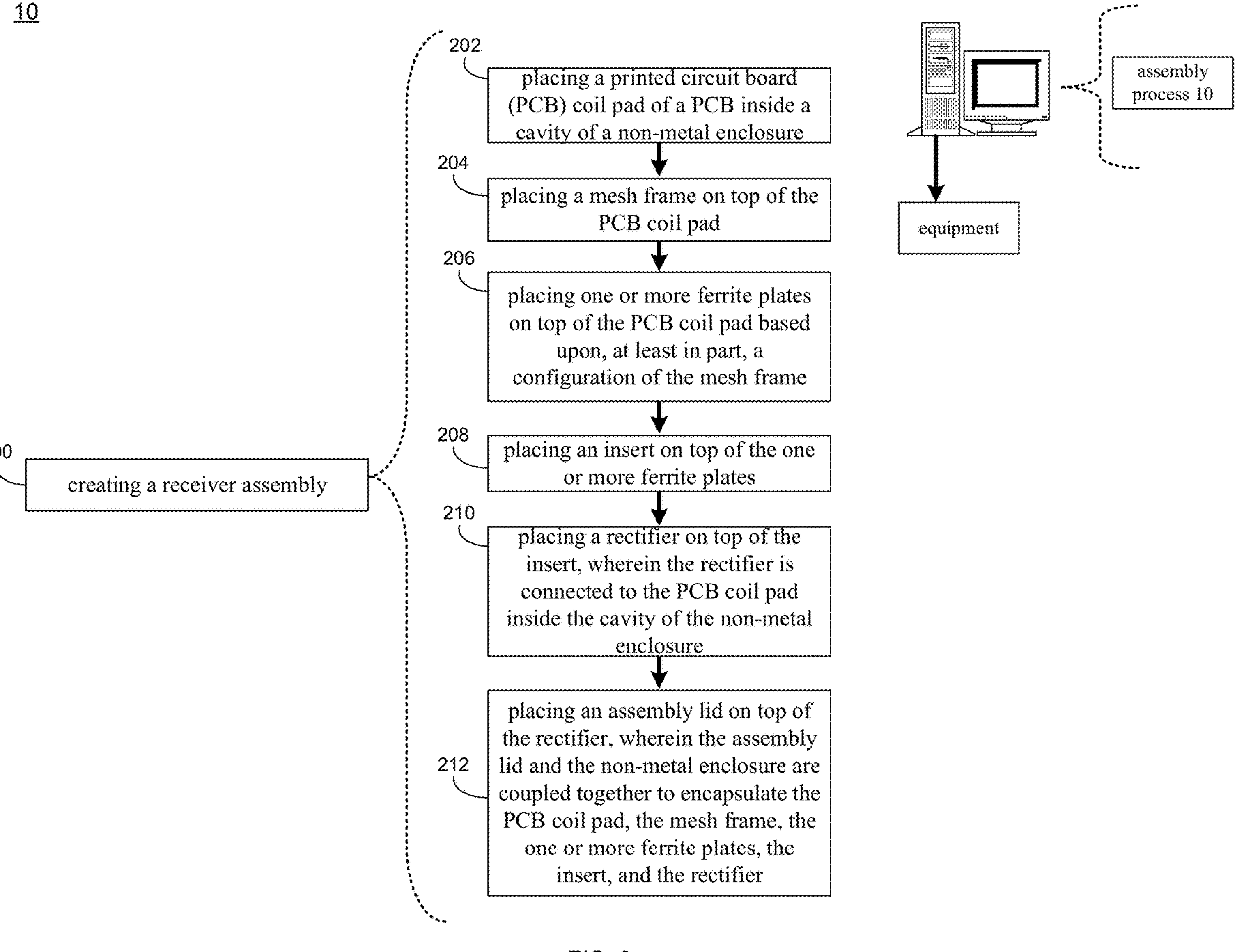
FIG. 2 is an example flowchart of an assembly process according to one or more example implementations of the disclosure.

System Overview:

Electrical vehicles (EV) are great for the environment, as they may reduce air pollution and greenhouse gas emissions. The batteries of EVs may be charged using specialized plugs or may be charged wirelessly. Some wireless charging systems, such as a conventional litz wire receiver pad and a separate coil/rectifier system, operate by having an inductive receiver pad wirelessly receive AC power energy from a transmitter. A rectifier converts AC power into DC power to charge the vehicle's battery. An example EV (e.g., EV 100) for wireless charging can be seen in FIG. 1.

Generally, EV 100 may have a rectifier (e.g., rectifier 102) and a receiver (e.g., receiver 104). For example, rectifier 102 converts AC power into DC power to charge the vehicle's battery (e.g., battery 106). The separate rectifier and receiver may require individual packages and installation for these two parts, increasing the manufacturing cost and wasting space on the chassis. Although wireless charging for EVs may reduce the anxiety of range and manual operation, this installation space requirement and higher cost may prevent customers from paying for this optional charging method. For the rectifier, the module may use bulky components, such as capacitors and inductors. This may lead to a larger total rectifier volume. Thus, reducing the cost and size of wireless EV charging components should be addressed to increase EV wireless charging adoption.

Therefore, as will be discussed below, the present disclosure may provide a more compact and low-cost solution for an EV wireless charging receiving module, as compact and low-cost wireless charging systems may make EVs easier and more convenient to be charged, thereby increasing adoption of electric transportation. Additionally, a compact and low-cost receiver assembly may be more flexible and may be retrofitted to a wider range of vehicles, making it more versatile in terms of compatibility with different types of charging infrastructure. The design of the present disclosure may integrate an inductive wireless charging coil and rectifier using printed circuit board (PCB)-based technology, as well as other sub-components.

The Assembly Process:

As discussed above and referring also at least to the example implementations of FIGS. 2-11, assembly process 10 may create 200 a receiver assembly. Assembly process 10 may create the receiver assembly by placing 202 a printed circuit board (PCB) coil pad of a PCB inside a cavity of a non-metal enclosure. Assembly process 10 may create the receiver assembly by placing 204 a mesh frame on top of the PCB coil pad. Assembly process 10 may create the receiver assembly by placing 206 one or more ferrite plates on top of the PCB coil pad based upon, at least in part, a configuration of the mesh frame. Assembly process 10 may create the receiver assembly by placing 208 an insert on top of the one or more ferrite plates. Assembly process 10 may create the receiver assembly by placing 210 a rectifier on top of the insert, wherein the rectifier may be connected to the PCB coil pad inside the cavity of the non-metal enclosure. Assembly process 10 may create the receiver assembly by placing 212 an assembly lid on top of the rectifier, wherein the assembly lid and the non-metal enclosure may be coupled together to encapsulate the PCB coil pad, the mesh frame, the one or more ferrite plates, the insert, and the rectifier.

As will be discussed further below, the present disclosure may, in some implementations, utilize PCB-based technology with copper traces embedded in the PCB board to uniquely replace conventional Litz wire coils. This may reduce the weight of the coil component, and PCB coils are easier to repair and maintain, as they are relatively smaller and easier to access than traditional coils. Additionally, the present disclosure may, in some implementations, integrate a rectifier and a coil, which may require less effort to design individual packaging and installation, and may reduce overall receiver assembly cost.

Figure 3:
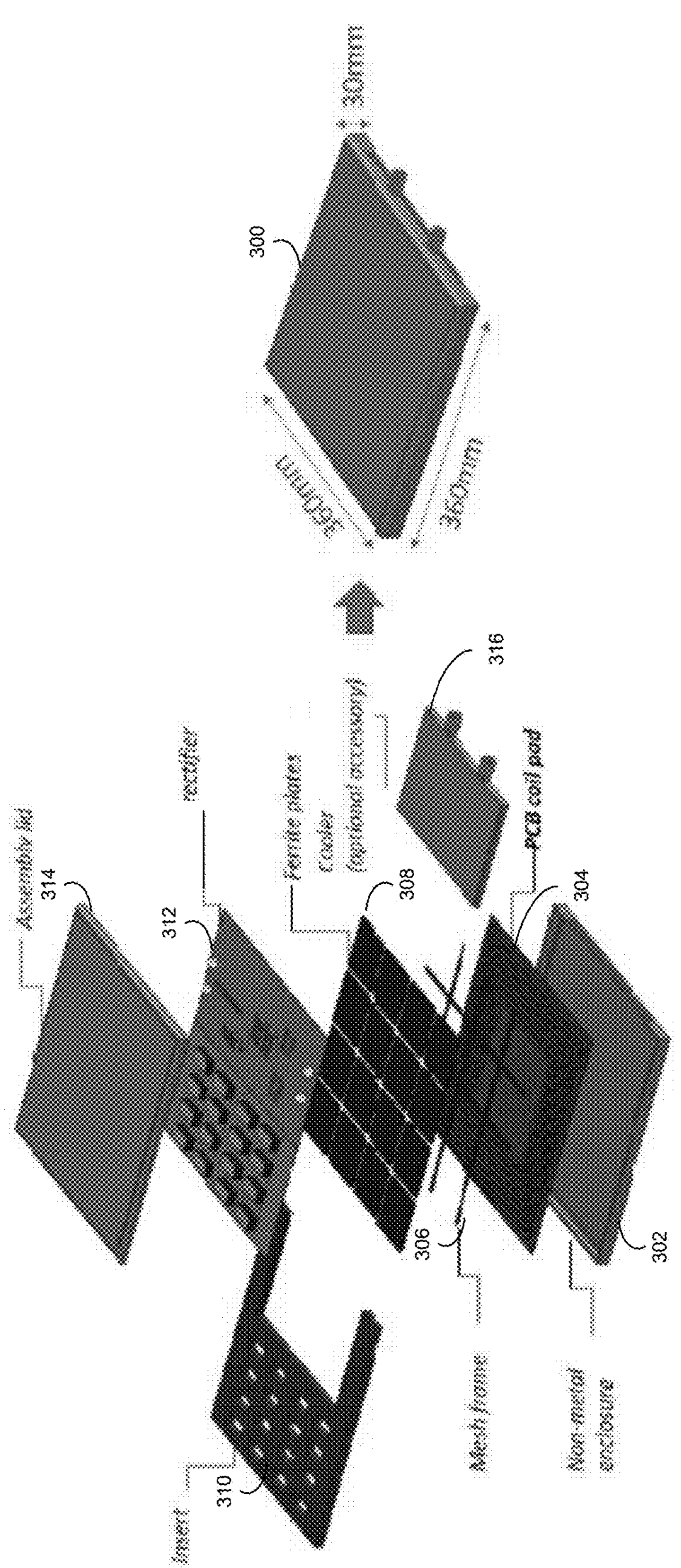
FIG. 3 diagrammatic view of a PCB-based receiver assembly (exploded view and assembly view) according to one or more example implementations of the disclosure.
Figure 4:
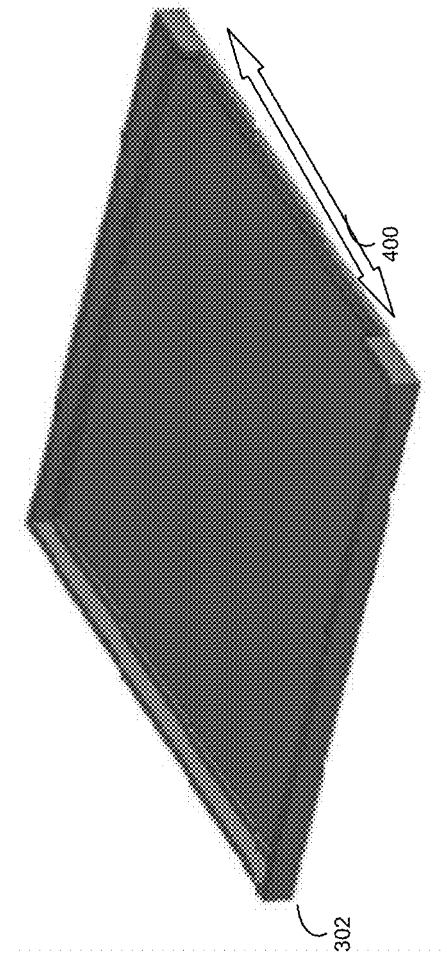
FIG. 4 is an example diagrammatic view of an enclosure according to one or more example implementations of the disclosure.
Figure 5:
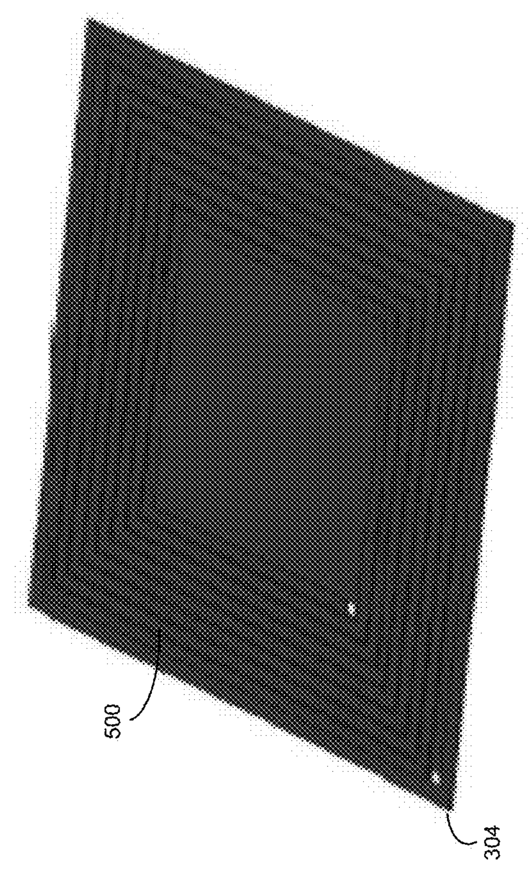
FIG. 5 is an example diagrammatic view of a PCB-based coil for wireless charging according to one or more example implementations of the disclosure.
Figure 6:
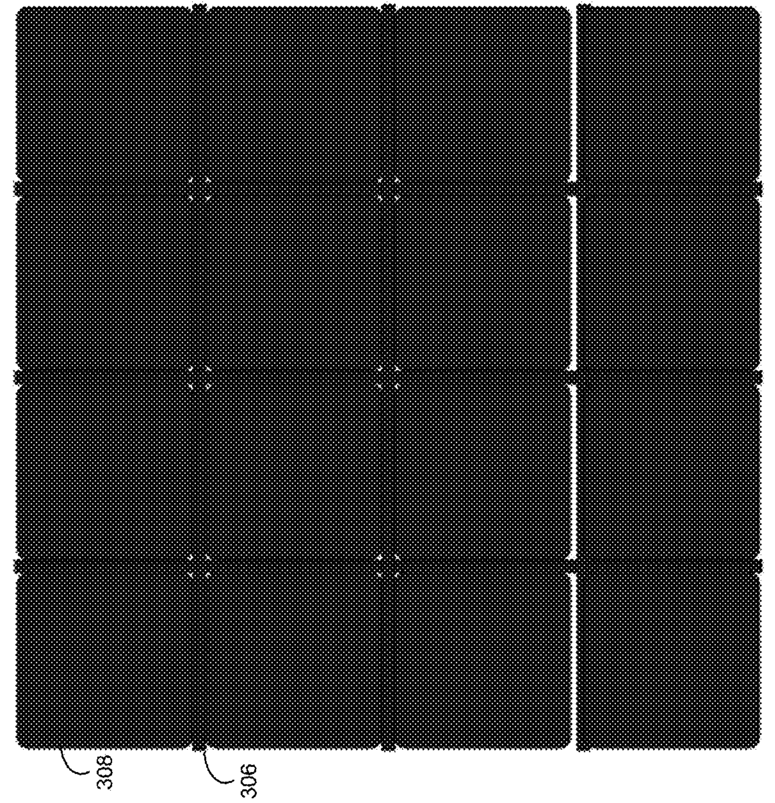
FIG. 6 is an example diagrammatic view of mesh frame according to one or more example implementations of the disclosure.

For example, and referring at least to the example implementation of FIG. 3, an example design of a PCB-based receiver assembly (e.g., receiver assembly 300) is shown in an exploded view (left) and assembled view (right), which may be similarly positioned according to FIG. 1. In some implementations, assembly receiver 300 may include, e.g., an enclosure (e.g., non-metal enclosure 302), a PCB coil pad (e.g., PCB coil pad 304), a mesh frame (e.g., mesh frame 306), one or more ferrite plates (e.g., ferrite plate 308), an insert (e.g., insert 310), a rectifier (e.g., rectifier 312), and an assembly lid (e.g., assembly lid 314). As will be discussed in greater detail below, in some implementations, an optional cooler/cold plate (e.g., cold plate 316) may be used.

In some implementations, assembly process 10 may create 200 a receiver assembly (e.g., receiver assembly 300), and in some implementations, assembly process 10 may create the receiver assembly by placing 202 a printed circuit board (PCB) coil pad of a PCB inside a cavity of a non-metal enclosure. For instance, and referring at least to the example implementations, of FIG. 4 and FIG. 5, an example non-metal enclosure 302 and PCB coil pad 304 are shown respectively. In some implementations, non-metal enclosure 302 may be considered the base plate of receiver assembly 300. Non-metal enclosure 302 may be made of a non-metal material, such as, e.g., high-temperature durable plastic, lightweight fiberglass, etc. Generally, as the name suggests, non-metal enclosure 302 should not be metal, due to its interference with power transfer. The inner side of non-metal enclosure 302 may have a cavity for receiving PCB coil pad 304. As will be discussed further below, open slot 400 on the right side may be for inserting an optional cooler if needed. It will be appreciated that any standard PCB assembly/printing/fabrication, etc. equipment, as well as any other necessary equipment, may be used singly or in any combination with assembly process 10, which may be operatively connected to a computing device, such as the computing device shown in FIG. 2, to obtain their instructions.

In some implementations, PCB coil pad 304 may include copper traces (e.g., copper traces 500) embedded in the PCB. For example, PCB coil pad 304 may be a two or more layers PCB based on power level requirements. In this example, there is shown a 9-turn 12-layer board with a 0.8 mm trace width following a twist pattern. It will be appreciated that these parameters may be adjusted for power transfer efficiency optimization purposes. It will also be appreciated that different copper trace designs may be used as well. As such, the description of the parameters and copper trace design should be taken as example only and not to otherwise limit the scope of the present disclosure. In some implementations, in this example, the basic requirement for this PCB is that the wireless power transfer efficiency should be at or above 90% with a gap between the transmitter and receiver beyond 150 mm.

In some implementations, assembly process 10 may create the receiver assembly by placing 204 a mesh frame on top of the PCB coil pad. For instance, and referring to the example implementation of FIG. 6, an example mesh frame (e.g., mesh frame 306) is shown. In some implementations, as will be discussed below, the function of mesh frame 306 may be mainly for placement of ferrite plates (e.g., when the ferrite plate is an array of ferrite plates as discussed below). Since available and inexpensive ferrite plates are generally small in size (e.g., 30 mm×30 mm to 240 mm×60 mm), mesh frame 306 may be useful for placing ferrite plates 308. In some implementations, the material of mesh frame 306 may be non-metal, such as plastic, fiberglass, etc. Mesh frame 306 may be one piece or more single pieces, such as stick-like shapes, for more installation flexibility. It will be appreciated that mesh frame 306 may not be needed when ferrite plate 308 is a single plate that is the same size as the PCB coil pad. It will also be appreciated that other techniques for placement of ferrite plates may be used without departing from the scope of the present disclosure, such that mesh frame 306 may not be needed at all. For example, machine placement may be beneficial for mass production, whereas manual placement may benefit from using the mesh frame for alignment.

In some implementations, assembly process 10 may create the receiver assembly by placing 206 one or more ferrite plates 308 on top of PCB coil pad 304 based upon, at least in part, a configuration of the mesh frame 306. For instance, and referring still to FIG. 6 and at least to the example implementation of FIG. 7, an example ferrite plate 308 is shown as a single piece (A) on the left and as an array of ferrite plates 308 (B) on the right. As noted above, the function of mesh frame 306 may be mainly for placement of ferrite plates (e.g., when the ferrite plate is an array of ferrite plates as discussed below). As such, the placement of the array of ferrite plates in FIG. 7 may be based upon the configuration of mesh frame 306 in FIG. 6. Generally, the function of ferrite plate 308 is to block magnetic leakage. To accomplish this, in some implementations, one or more ferrite plates 308 may be a single ferrite plate (A) having a size of PCB coil pad 304. For instance, ideally, ferrite board 308 is one piece that is the same size as PCB coil pad 304 (e.g., 8×8×2 $mm^3$ in the example shown). However, the availability of a large ferrite board is low and the cost is much higher than those that are smaller.

Figure 7:
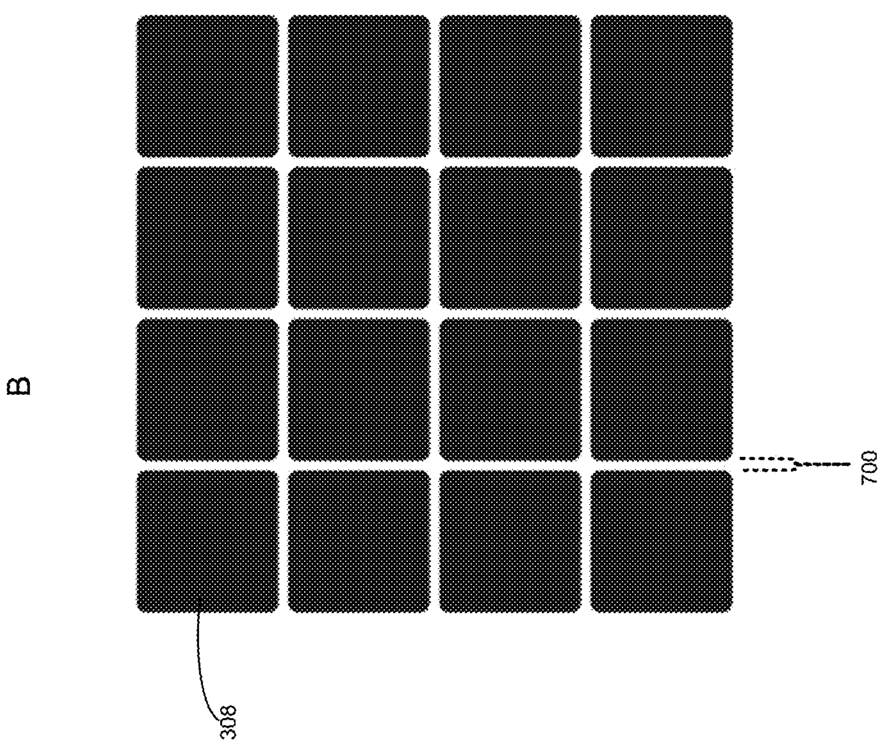
FIG. 7 is an example diagrammatic view of a ferrite plate according to one or more example implementations of the disclosure.
Figure 7:
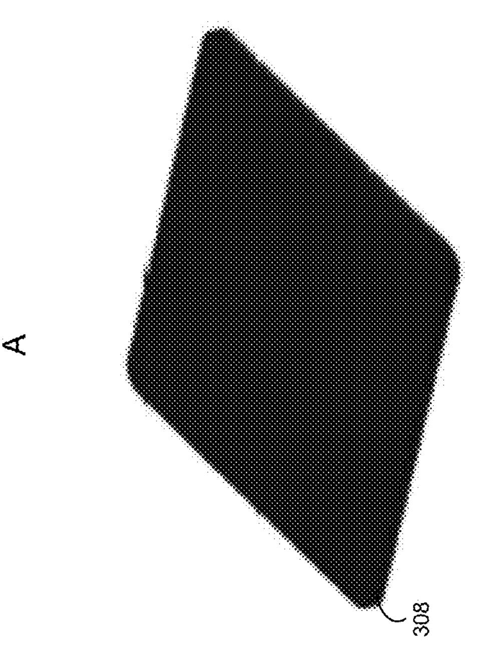
Figure 8:
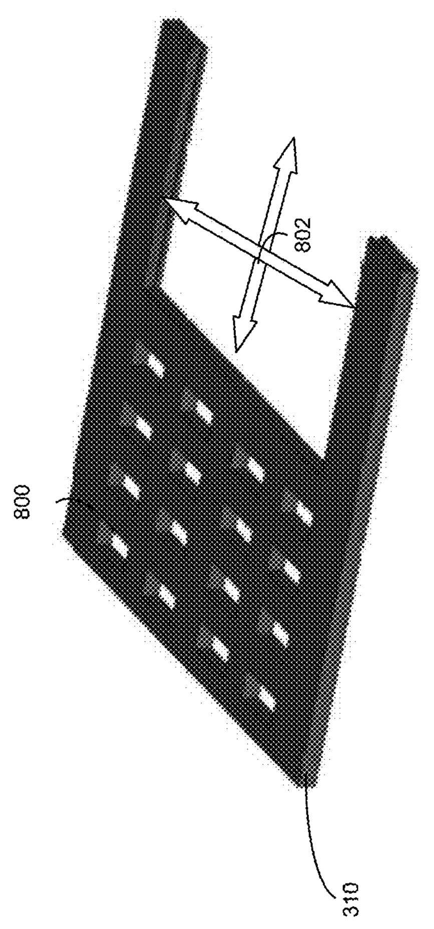
FIG. 8 is an example diagrammatic view of an insert according to one or more example implementations of the disclosure.
Figure 9:
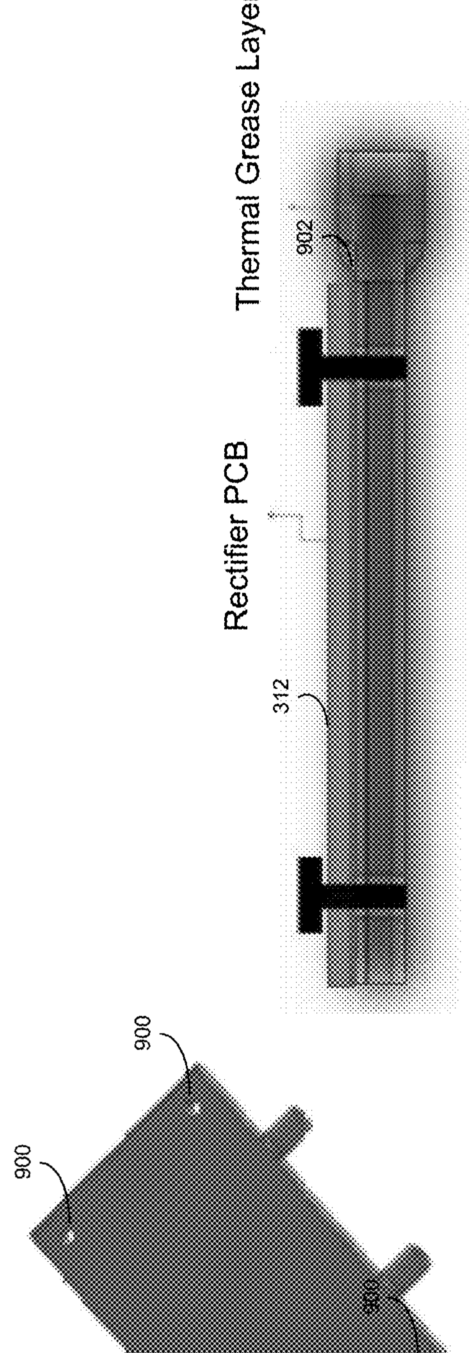
FIG. 9 is an example diagrammatic view of a cooler/cold plate according to one or more example implementations of the disclosure.
Figure 10:
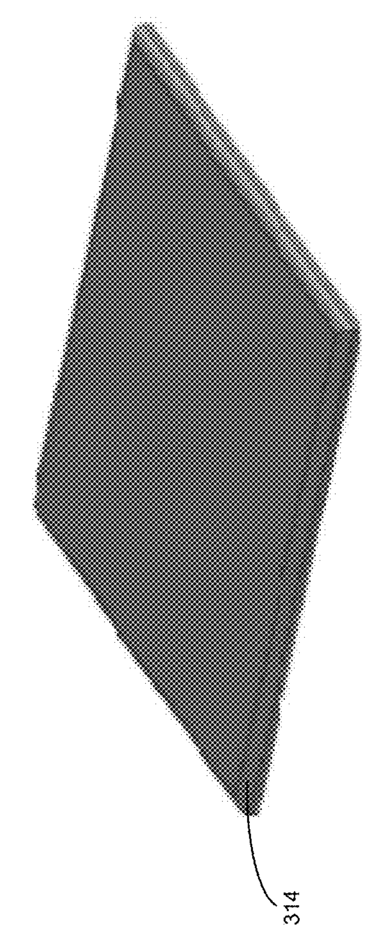
FIG. 10 is an example diagrammatic view of an assembly lid according to one or more example implementations of the disclosure.

As such, in some implementations to block magnetic leakage, one or more ferrite plates 308 may be an array of ferrite plates with a gap between each ferrite plate of the array of ferrite plates, wherein in some implementations, the gap may be determined based upon, at least in part, mesh frame 306. For instance, (B) in FIG. 7 shows an array of small ferrite plates 308 (also shown in FIG. 3). These plates do not necessarily have to be side by side. By having a gap (e.g., gap 700) between ferrite plates 308, the magnetic blocking may still be adequate, while the total weight may be reduced with less material being used than a single ferrite plate. In some implementations, as discussed above with FIG. 6, the gap distance may be determined by the mesh frame design. It will be appreciated that the gap size may vary between the horizontal and vertical ferrite plates as well as between each ferrite plate. For example, depending on the ferrite plate size, the gap may be less than 10% of the ferrite width. For instance, if a 30 mm×30 mm plate was used, the gap may be below 3 mm. However, if a very large plate is used, it may be desirable for the gap not to go over 10 mm. For instance, if there is a 150 mm×150 mm ferrite, the gap between two plates generally should not go above 10 mm instead of 15 mm. Notably, the ferrite plates for magnetic blocking, and the block shape ferrite core in the rectifier are different. The ferrite core in the rectifier board is generally only functioning as a necessary part of the inductors.

In some implementations, assembly process 10 may create the receiver assembly by placing 208 an insert on top of the one or more ferrite plates. For instance, and referring at least to the example implementation of FIG. 8, an example insert (e.g., insert 310) is shown. In the example, insert 310 may have at least two main functions; one is to fix the location of the upper side rectifier board by those cavities (e.g., cavities 800) for the inductor's ferrite core. The other function is to offer a slot (e.g., slot 802) for inserting the optional cold plate (e.g., cooler, discussed below) for high-power applications. The material of insert 310 may be either non-metal for lightweight purposes or metal for better heat dissipation. Since the array of ferrite plates 308 underneath already block the magnetic leakage, there is little to no concern of magnetic leakage interference by insert 310.

In some implementations, as noted above, insert 310 may include slot 802 for receiving a cold plate. For instance, and referring to the example implementation of FIG. 9, an example cold plate (e.g., cold plate 316) is shown. In the example, cold plate 316 (also referred to generally herein as cooler) may be an optional accessory depending on the power level application. For instance, the higher the charging power is, the more power loss it would be to generate heat from the receiver module with a certain transfer efficiency. Thus, for higher power applications, active cooling may be necessary. Otherwise, the receiver module may overheat and damage. In some implementations, the total volume of receiver assembly 300 may be, e.g., ~3.9 L, which is roughly half of conventional systems. The target power level of receiver assembly 300 for EV wireless power transfer is from, e.g., 3 kW to 22 kW, and for low-power applications, e.g., below 11 kW, the optional liquid cooling cooler (e.g., cold plate 316) may be eliminated. For higher power applications (e.g., above 11 kW), active cooling may be necessary, and the cooler (e.g., cold plate 316) may be slid into insert 310 (e.g., via slot 802 and slot 400 of non-metal enclosure 302) with coolant running inside. In some implementations, the maximum allowed temperature may be, e.g., 150 deg. C., which is a typical limitation for power electronics. The cold plate may be any existing commercial product with at least one inlet and at least one outlet or customized based on installation requirements. As used herein, the terms "cold plate" and "cooler" may be used interchangeably. The cold plate may be compatible with the slot design of insert 310. It will be appreciated that fastening features may need to be considered during assembly. For example, in FIG. 9, bolt holes (e.g., bolt holes 900) may be placed at the corner of the cold plate (or other appropriate location). With compression from fastening, and the addition of a thermal grease layer (e.g., thermal grease layer 902), the cold plate may evenly dissipate heat from rectifier PCB 312. It will be appreciated that other fastening methods may also be used without departing from the scope of the present disclosure.

In some implementations, assembly process 10 may create the receiver assembly by placing 210 a rectifier on top of the insert, wherein the rectifier may be connected to PCB coil pad 304 inside the cavity of the non-metal enclosure. For instance, and referring to the example implementation of FIG. 10, an example rectifier PCB (e.g., rectifier PCB 312) is shown. In the example, the rectifier is connected to the PCB coil pad/board (e.g., with any connection type being used, such as wiring, soldering, clamping, etc.). In this example, there is shown a hybrid rectifier, which has a separate power loop using metal PCB and a PCB winding inductance loop using FR4 PCB. The example hybrid metal core PCB and FR4 PCB winding inductor of the hybrid rectifier, compared to a conventional rectifier, separates the inductance parts and the power loop part using two different types of PCB. For the inductor side (left), the PCB may be, e.g., an 8-layer PCB board with PCB windings embedded inside the board. For the power side (right), the PCB may be a metal PCB that is good for thermal dissipation. As can be seen from FIG. 10, the power side occupies a lot of planar space because of the use of surface mount components to reduce the thickness. The main contributor to the thickness, in this example, may be the ferrite core from the inductor side. To further reduce the thickness of the rectifier, a challenge may be how to reduce the thickness of the inductor ferrite core by adjusting the design of the power side for more space for inductors. With a given planar size limitation, more space for inductance may enable an increasing number of inductors using even smaller size components.

As will be appreciated, other electronic components may be included in receiver assembly. For example, electronic components include further include capacitors, switches, diodes, and other general components used in power electronics. These components may be planar devices that may be surface mounted on the rectifier PCB board.

In some implementations, assembly process 10 may create the receiver assembly by placing 212 an assembly lid on top of the rectifier, wherein the assembly lid and the non-metal enclosure may be coupled together to encapsulate the PCB coil pad, the optional mesh frame, the one or more ferrite plates, the insert, and the rectifier. For instance, and referring to the example implementation of FIG. 10, an example assembly lid (e.g., assembly lid 314) is shown. In some implementations, assembly lid 314 may be made of either metal or non-metal material. If it is metal, the heat dissipation ability and durability is better with increased weight.

In some implementations, assembly lid 314 may be attached directly to a vehicle chassis (e.g., as shown in FIG. 1). For instance, assembly lid 314 may be directly attached to the chassis of vehicle 100, thus, connectors may be needed, such as bolts, rail, plug, etc. When each of the components are put together, an example receiver assembly 300 is shown (as shown assembled in FIG. 3).

In some implementations, the rectifier and coil pad may be separate PCB boards, with a short connector such as a short AC cable, copper busbar, or other components to transfer AC power from the coil to the rectifier for AC-DC conversion. Since the two PCB boards are close to each other, the connection may be very short and compact without using any long AC cable.

It will be appreciated that while the description describes wireless charging of an EV battery, the present disclosure may be extended to wirelessly charge other types of batteries. As such, the use of wirelessly charging EV batteries should be taken as example only and not to otherwise limit the scope of the present disclosure.

In some implementations, the present disclosure may be embodied as a method, system, or computer program product. Accordingly, in some implementations, the present disclosure may take the form of an entirely hardware implementation, an entirely software implementation (including firmware, resident software, micro-code, etc.) or an implementation combining software and hardware aspects that may all generally be referred to herein as a "circuit," "module" or "system." Furthermore, in some implementations, the present disclosure may take the form of a computer program product on a computer-usable storage medium having computer-usable program code embodied in the medium.

In some implementations, any suitable computer usable or computer readable medium (or media) may be utilized. The computer readable medium may be a computer readable signal medium or a computer readable storage medium. The computer-usable, or computer-readable, storage medium (including a storage device associated with a computing device or client electronic device) may be, for example, but is not limited to, an electronic, magnetic, optical, electromagnetic, infrared, or semiconductor system, apparatus, device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a digital versatile disk (DVD), a static random access memory (SRAM), a memory stick, a floppy disk, a mechanically encoded device such as punch-cards or raised structures in a groove having instructions recorded thereon, a media such as those supporting the internet or an intranet, or a magnetic storage device. Note that the computer-usable or computer-readable medium could even be a suitable medium upon which the program is stored, scanned, compiled, interpreted, or otherwise processed in a suitable manner, if necessary, and then stored in a computer memory. In the context of the present disclosure, a computer-usable or computer-readable, storage medium may be any tangible medium that can contain or store a program for use by or in connection with the instruction execution system, apparatus, or device.

In some implementations, a computer readable signal medium may include a propagated data signal with computer readable program code embodied therein, for example, in baseband or as part of a carrier wave. In some implementations, such a propagated signal may take any of a variety of forms, including, but not limited to, electromagnetic, optical, or any suitable combination thereof. In some implementations, the computer readable program code may be transmitted using any appropriate medium, including but not limited to the internet, wireline, optical fiber cable, RF, etc. In some implementations, a computer readable signal medium may be any computer readable medium that is not a computer readable storage medium and that can communicate, propagate, or transport a program for use by or in connection with an instruction execution system, apparatus, or device.

In some implementations, computer program code for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java®, Smalltalk, C++ or the like. Java® and all Java-based trademarks and logos are trademarks or registered trademarks of Oracle and/or its affiliates. However, the computer program code for carrying out operations of the present disclosure may also be written in conventional procedural programming languages, such as the "C" programming language, PASCAL, or similar programming languages, as well as in scripting languages such as Javascript, PERL, or Python. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN), a wide area network (WAN), a body area network BAN), a personal area network (PAN), a metropolitan area network (MAN), etc., or the connection may be made to an external computer (for example, through the internet using an Internet Service Provider). In some implementations, electronic circuitry including, for example, programmable logic circuitry, an application specific integrated circuit (ASIC), field-programmable gate arrays (FPGAs) or other hardware accelerators, micro-controller units (MCUs), or programmable logic arrays (PLAs) may execute the computer readable program instructions/code by utilizing state information of the computer readable program instructions to personalize the electronic circuitry, in order to perform aspects of the present disclosure.

In some implementations, the flowchart and block diagrams in the figures illustrate the architecture, functionality, and operation of possible implementations of apparatus (systems), methods and computer program products according to various implementations of the present disclosure. Each block in the flowchart and/or block diagrams, and combinations of blocks in the flowchart and/or block diagrams, may represent a module, segment, or portion of code, which comprises one or more executable computer program instructions for implementing the specified logical function(s)/act(s). These computer program instructions may be provided to a processor of a general purpose computer, special purpose computer, or other programmable data processing apparatus to produce a machine, such that the computer program instructions, which may execute via the processor of the computer or other programmable data processing apparatus, create the ability to implement one or more of the functions/acts specified in the flowchart and/or block diagram block or blocks or combinations thereof. It should be noted that, in some implementations, the functions noted in the block(s) may occur out of the order noted in the figures (or combined or omitted). For example, two blocks shown in succession may, in fact, be executed substantially concurrently, or the blocks may sometimes be executed in the reverse order, depending upon the functionality involved.

In some implementations, these computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks or combinations thereof.

In some implementations, the computer program instructions may also be loaded onto a computer or other programmable data processing apparatus to cause a series of operational steps to be performed (not necessarily in a particular order) on the computer or other programmable apparatus to produce a computer implemented process such that the instructions which execute on the computer or other programmable apparatus provide steps for implementing the functions/acts (not necessarily in a particular order) specified in the flowchart and/or block diagram block or blocks or combinations thereof.

The terminology used herein is for the purpose of describing particular implementations only and is not intended to be limiting of the disclosure. As used herein, the singular forms "a", "an" and "the" are intended to include the plural forms as well, unless the context clearly indicates otherwise. As used herein, the language "at least one of A and B" (and the like) as well as "at least one of A or B" (and the like) should be interpreted as covering only A, only B, or both A and B, unless the context clearly indicates otherwise. It will be further understood that the terms "comprises" and/or "comprising," when used in this specification, specify the presence of stated features, integers, steps (not necessarily in a particular order), operations, elements, and/or components, but do not preclude the presence or addition of one or more other features, integers, steps (not necessarily in a particular order), operations, elements, components, and/or groups thereof.

The corresponding structures, materials, acts, and equivalents (e.g., of all means or step plus function elements) that may be in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications, variations, substitutions, and any combinations thereof will be apparent to those of ordinary skill in the art without departing from the scope and spirit of the disclosure. The implementation(s) were chosen and described in order to explain the principles of the disclosure and the practical application, and to enable others of ordinary skill in the art to understand the disclosure for various implementation(s) with various modifications and/or any combinations of implementation(s) as are suited to the particular use contemplated.

Having thus described the disclosure of the present application in detail and by reference to implementation(s) thereof, it will be apparent that modifications, variations, and any combinations of implementation(s) (including any modifications, variations, substitutions, and combinations thereof) are possible without departing from the scope of the disclosure defined in the appended claims.

What is claimed is:

1. A receiver assembly comprising:

a receiver assembly, wherein the receiver assembly includes:

a printed circuit board (PCB) coil pad of a PCB inside a cavity of a non-metal enclosure;

a mesh frame on top of the PCB coil pad;

one or more ferrite plates on top of the PCB coil pad based upon, at least in part, a configuration of the mesh frame;

an insert on top of the one or more ferrite plates;

a rectifier on top of the insert, wherein the rectifier is connected to the PCB coil pad inside the cavity of the non-metal enclosure; and an assembly lid on top of the rectifier, wherein the assembly lid and the non-metal enclosure are coupled together to encapsulate the PCB coil pad, the mesh frame, the one or more ferrite plates, the insert, and the rectifier.

2. The receiver assembly of claim 1, wherein the insert includes a slot for receiving a cold plate.

3. The receiver assembly of claim 1, wherein the PCB coil pad includes copper traces embedded in the PCB.

4. The receiver assembly of claim 1, wherein the one or more ferrite plates is a single ferrite plate having a size of the PCB coil pad.

5. The receiver assembly of claim 1, wherein the one or more ferrite plates is an array of ferrite plates with a gap between each ferrite plate of the array of ferrite plates.

6. The receiver assembly of claim 5, wherein the gap is determined based upon, at least in part, the mesh frame.

7. The receiver assembly of claim 1, wherein the assembly lid is attached directly to a vehicle chassis.

8. A computer program product residing on a computer readable storage medium having a plurality of instructions stored thereon which, when executed across one or more processors, causes at least a portion of the one or more processors to perform operations comprising:

creating a receiver assembly, wherein creating the receiver assembly includes:

placing a printed circuit board (PCB) coil pad of a PCB inside a cavity of a non-metal enclosure;

placing a mesh frame on top of the PCB coil pad;

placing one or more ferrite plates on top of the PCB coil pad based upon, at least in part, a configuration of the mesh frame;

placing an insert on top of the one or more ferrite plates;

placing a rectifier on top of the insert, wherein the rectifier is connected to the PCB coil pad inside the cavity of the non-metal enclosure; and placing an assembly lid on top of the rectifier, wherein the assembly lid and the non-metal enclosure are coupled together to encapsulate the PCB coil pad, the mesh frame, the one or more ferrite plates, the insert, and the rectifier.

9. The computer program product of claim 8, wherein the insert includes a slot for receiving a cold plate.

10. The computer program product of claim 8, wherein the PCB coil pad includes copper traces embedded in the PCB.

11. The computer program product of claim 8, wherein the one or more ferrite plates is a single ferrite plate having a size of the PCB coil pad.

12. The computer program product of claim 8, wherein the one or more ferrite plates is an array of ferrite plates with a gap between each ferrite plate of the array of ferrite plates.

13. The computer program product of claim 12, wherein the gap is determined based upon, at least in part, the mesh frame.

14. The computer program product of claim 8, wherein the assembly lid is attached directly to a vehicle chassis.

15. A method comprising:

creating a receiver assembly, wherein creating the receiver assembly includes:

placing a printed circuit board (PCB) coil pad of a PCB inside a cavity of a non-metal enclosure;

placing a mesh frame on top of the PCB coil pad;

placing one or more ferrite plates on top of the PCB coil pad based upon, at least in part, a configuration of the mesh frame;

placing an insert on top of the one or more ferrite plates;

placing a rectifier on top of the insert, wherein the rectifier is connected to the PCB coil pad inside the cavity of the non-metal enclosure; and placing an assembly lid on top of the rectifier, wherein the assembly lid and the non-metal enclosure are coupled together to encapsulate the PCB coil pad, the mesh frame, the one or more ferrite plates, the insert, and the rectifier.

16. The method of claim 15, wherein the insert includes a slot for receiving a cold plate.

17. The method of claim 15, wherein the PCB coil pad includes copper traces embedded in the PCB.

18. The method of claim 15, wherein the one or more ferrite plates is one of a single ferrite plate having a size of the PCB coil pad and an array of ferrite plates with a gap between each ferrite plate of the array of ferrite plates.

19. The method of claim 18, wherein the gap is determined based upon, at least in part, the mesh frame.

20. The method of claim 15, wherein the assembly lid is attached directly to a vehicle chassis.

* * * * *